(12) United States Patent
Hinkle

(10) Patent No.: US 7,318,769 B2
(45) Date of Patent: Jan. 15, 2008

(54) SYSTEM AND METHOD FOR REMOVING FILM FROM PLANAR SUBSTRATE PERIPHERIES

(75) Inventor: James Ernest Hinkle, Lambertville, MI (US)

(73) Assignee: First Solar, Inc., Perrysburg, OH (US)

(*) Notice: Subject to any disclaimer, the term of this patent is extended or adjusted under 35 U.S.C. 154(b) by 106 days.

(21) Appl. No.: 11/284,028

(22) Filed: Nov. 22, 2005

(65) Prior Publication Data
US 2006/0108583 A1    May 25, 2006

Related U.S. Application Data

(60) Provisional application No. 60/629,897, filed on Nov. 23, 2004.

(51) Int. Cl.
*B24B 1/00* (2006.01)

(52) U.S. Cl. .......................................... 451/38; 451/82
(58) Field of Classification Search ................ 451/38, 451/39, 40, 80, 82, 84; 438/48; 257/48
See application file for complete search history.

(56) References Cited

U.S. PATENT DOCUMENTS

| | | | |
|---|---|---|---|
| 5,163,253 A * | 11/1992 | Carpenter, Jr. ................ | 451/38 |
| 6,340,640 B1 * | 1/2002 | Nishimoto et al. .......... | 438/753 |
| 6,423,565 B1 * | 7/2002 | Barth et al. .................... | 438/57 |

* cited by examiner

*Primary Examiner*—Jacob K. Ackun, Jr.
(74) *Attorney, Agent, or Firm*—Steptoe & Johnson LLP (57) ABSTRACT

A system for removing film from a planar substrate includes a shuttle which transports a film-coated substrate through a film removal station to a rotation station. At the rotation station, the substrate is removed from the shuttle and rotated to a new orientation. After being repositioned on the shuttle, the substrate is transported by the shuttle through a second film removal station.

30 Claims, 12 Drawing Sheets

SYSTEM AND METHOD FOR REMOVING FILM FROM PLANAR SUBSTRATE PERIPHERIES

CLAIM OF PRIORITY

This application claims priority under 35 U.S.C. § 119(e) to U.S. Provisional Patent Application Ser. No. 60/629,897 filed Nov. 23, 2004, the entire contents of which is hereby incorporated by reference.

TECHNICAL FIELD

The present invention relates to photovoltaic device production.

BACKGROUND

In the manufacture of a photovoltaic device, semiconductor material is deposited on a glass substrate. As a result of this deposition, one face and the edges of the substrate can be coated with the semiconductor material. In order to produce a photovoltaic device, it is desirable to remove the deposited semiconductor material from the edges of the substrate and from the peripheries of the coated face of the substrate. Sandblasting can be utilized to remove the robust semiconductor material coating at the peripheries and edges of a photovoltaic device.

SUMMARY

In general, a system for removing a film from a plurality of peripheries of a surface of a substantially planar substrate includes a housing, a first film removal zone inside the housing, a second film removal zone inside the housing adjacent to the first film removal zone, a rotation zone between the first removal zone and the second removal zone, and a shuttle configured to transport the substrate through the first film removal zone to the rotation zone and from the rotation zone through the second film removal zone. Provided within the rotation zone is a rotation station having components which accomplish rotation of the substrate. Likewise, a film removal station having equipment which removes film from a surface of the substrate is provided at each film removal zone. The film removal stations are intended to receive a substrate having a film-coated surface that is substantially planar. The film removal stations may be used to process surfaces having minor variations; however a film-coated surface to be processed should be sufficiently planar that it may be received in the film removal stations such that the film is successfully removed from the substrate.

In one aspect, a system for removing a film from a plurality of peripheries of a surface of a substantially planar substrate includes an introduction station, an exit station, and a shuttle positioned between the introduction station and the exit station. The shuttle is configured to transport the substrate from a first terminal position adjacent to the introduction conveyor and a second terminal position at a distance from the introduction position. The first terminal position and second terminal position define a transport axis. The shuttle has a frame configured to hold the substrate, a first end directed toward the first terminal position, and a second end directed toward the second terminal position. The system also includes a rotation station positioned between the first terminal position and the second terminal position, a first film removal station proximate to the first terminal position, and a second film removal station proximate to the second terminal position. The system can include a housing substantially enclosing the first film removal station, the rotation station, and the second film removal station.

The rotation station can include a support configured to rotate the substrate around an axis perpendicular to the transport axis. The support can include a suction cup for securing the substrate to the support. The support can rotate the substrate 90 degrees.

The housing can have an operating pressure that is lower than the pressure external to the housing. A portion of the housing can be transparent.

The shuttle can include a plurality of suction cups configured to maintain the position of the substrate on the frame. The first end can be configured to hold the substrate in a first orientation and the second end can be configured to hold the substrate in a second orientation.

The first film removal station can include a first film removal nozzle. The first film removal nozzle can be positioned such that a periphery of a surface of the substrate passes within film removal range of the first film removal nozzle as the shuttle moves along the transport axis passing the rotation station. The second film removal station can include a second film removal nozzle. The second film removal nozzle can be positioned such that a periphery of a surface of the substrate passes within film removal range of the second film removal nozzle as the shuttle moves along the transport axis after passing the rotation station. In certain circumstances, each film removal station can include two film removal nozzles positioned such that each of two peripheries of a surface of a planar substrate passes within film removal range of the respective film removal nozzle as the shuttle moves along the transport axis. Each film removal nozzle, independently, can be a sandblasting nozzle.

The system can include a blast box enclosing a sandblasting nozzle. The blast box can include a passage through which the nozzle accesses the periphery of the substrate. The blast box can include an exhaust port configured to withdraw sandblasting residue from the blast box.

Each film removal station can include a buffer wheel configured to be positioned to contact a periphery of the substrate as the shuttle moves along the transport axis. The system can also include a guide configured to position the substrate on the first end of the shuttle. The guide may include multiple guide wheels, guide bars, pneumatically extendable guide bumpers, or any other known instrumentality for squaring the substrate during its introduction to the first end of the shuttle.

In another aspect, a method for removing a film from a plurality of peripheries of a surface of a substantially planar substrate includes introducing the planar substrate to a first region of a shuttle, transporting the shuttle from a first terminal position toward a second terminal position along a transport axis such that a first periphery of a surface of the substrate passes within film removal range of a first film removal station as the shuttle moves along the transport axis to a rotation station, rotating the substrate at the rotation station, transporting the shuttle from the rotation station to the second terminal position such that a second periphery of a surface of the substrate passes within film removal range of a second film removal station as the shuttle moves along the transport axis to the second terminal position, and removing the substrate from the shuttle.

In the method, rotating the substrate at the rotation station can include removing the substrate from the first region of the shuttle, altering the orientation of the substrate relative to the transport axis, moving the shuttle to position a second region of the shuttle to receive the substrate, and positioning the planar substrate in the second region of the shuttle. Introducing the planar substrate can include moving the substrate with an introduction conveyor. Removing the substrate can include moving the substrate with an exit conveyor.

The first film removal station and the second film removal station can be enclosed in a controlled atmosphere. The method can include reducing the controlled atmosphere to a pressure lower than pressure external to the controlled atmosphere. For example, an exhaust or system may be provided for the housing such that air is evacuated from the internal atmosphere, resulting in a lower pressure inside the housing than outside the housing. This provides effective containment within the housing of residue generated in the film removal process. Similarly, exhaust outlets may be situated proximate to points inside the housing where residue is generated, providing more localized management of the residue, which may be transported by the exhaust system away from system components. The method can include positioning the planar substrate on the shuttle.

The system and method described here has advantages over known methods for removing semiconductor material coating from the peripheries of the coated surface and the edges generally utilize complex manufacturing systems having multiple conveyors for transporting the glass substrate. These conveyors are not arranged in a collinear fashion; that is, removing the semiconductor material coating from adjacent peripheries and edges of the substrate requires processing the substrate in multiple nonlinear steps requiring a great deal of production space and human intervention. This results in an undesirable lack of uniformity among the finished photovoltaic devices. The nonlinear nature of known systems and the required human intervention also add undesirable costs due to compromised efficiency and larger space requirements. Additionally, the nonlinear setup and human intervention prevent known systems from being effectively enclosed from the work environment. As a result, maintenance of the production equipment requires constant management of sandblasting residue and workers must wear protective respirators. The system and method for removing film from a photovoltaic device at the peripheries of the coated surface and the edges provides for in-line processing and resulting benefits such as decreased maintenance, safer work conditions, higher product uniformity and increased efficiency.

DETAILED DESCRIPTION

Figure 1:
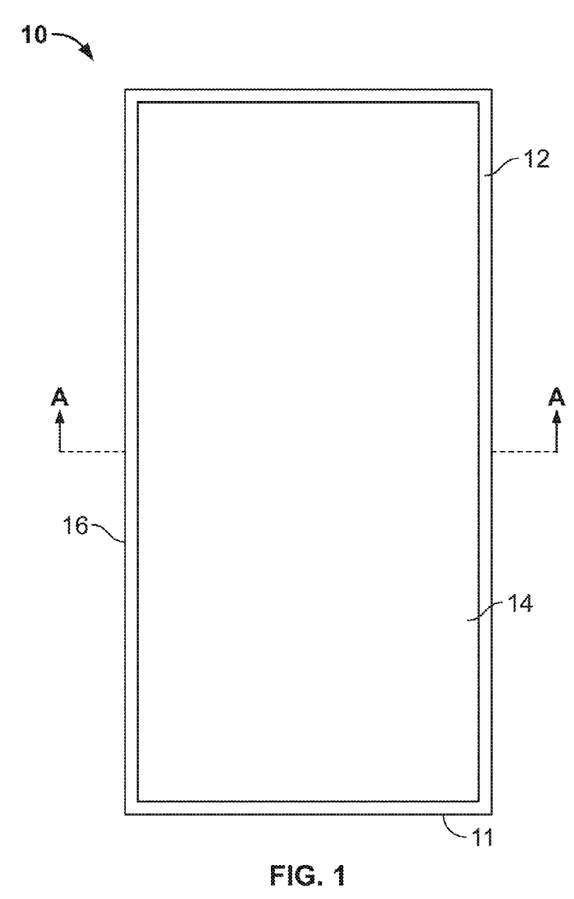
FIG. 1 is a drawing depicting the upper surface of a photovoltaic device after the manufacturing step of removing film from the peripheries of the upper surface.
Figure 2:
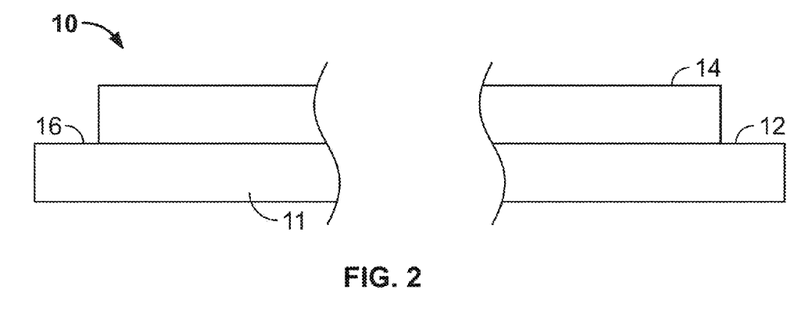
FIG. 2 is a drawing depicting a second view of the photovoltaic device depicted in FIG. 1 as shown along the A-A bisection.

FIG. 1 and FIG. 2 show a photovoltaic device 10 where material deposited on a surface of substrate 11, for example semiconductor material such as cadmium sulfide or cadmium telluride, has been removed at the peripheries 12 of the surface of substrate 11, forming an uncoated path on the surface of substrate 11 circumscribing the coating 14. Semiconductor material has also been removed from edges 16 of substrate 11.

Figure 3:
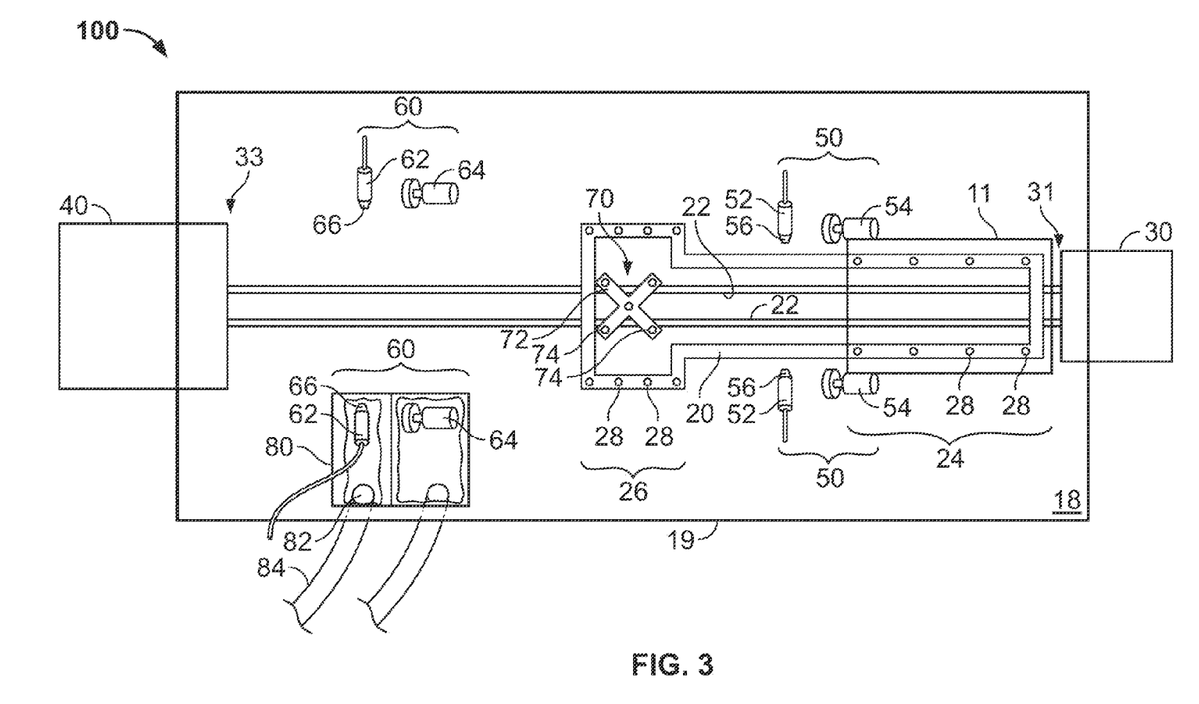
FIG. 3 is a drawing depicting a plan view of an embodiment of a system for removing a film from the peripheries and edges of a substrate at an early stage in the film-removal process.
Figure 4:
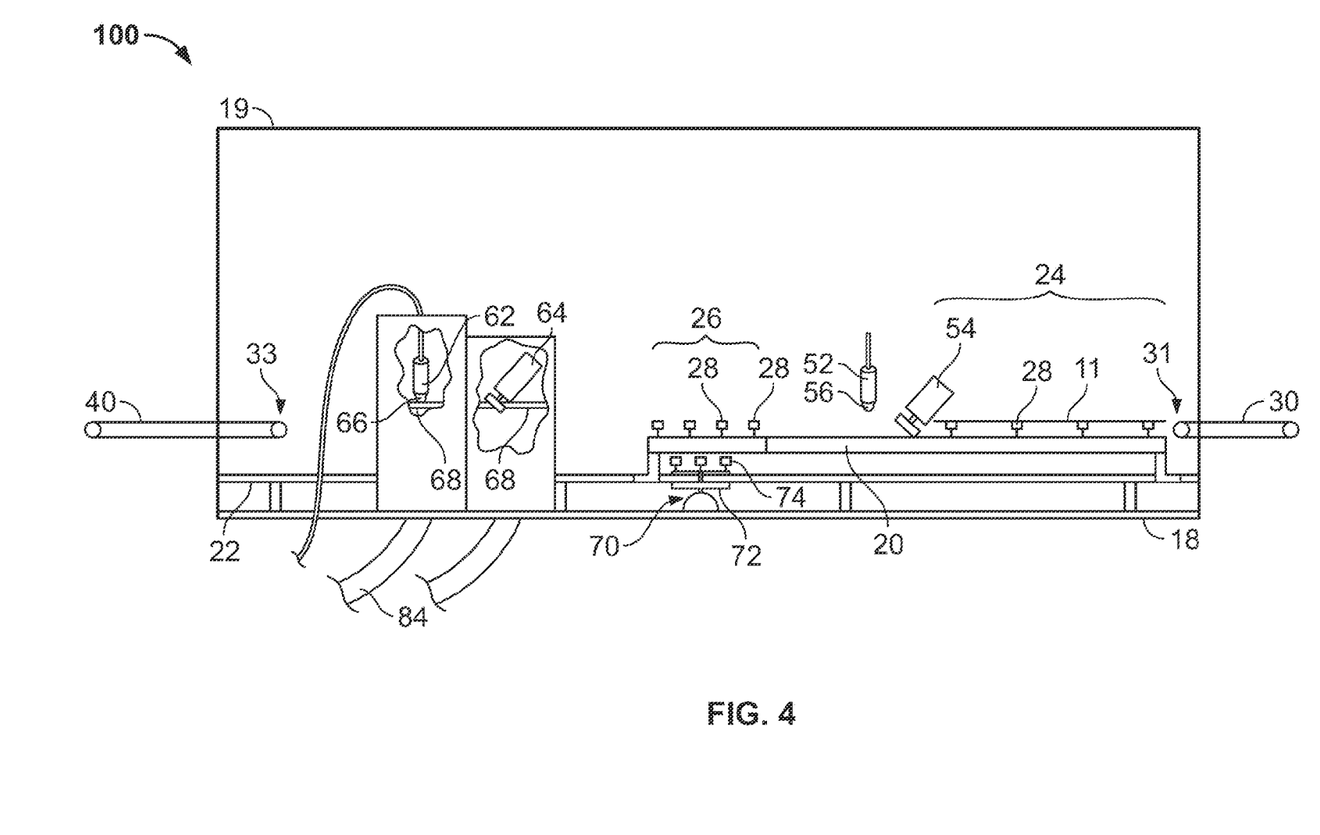
FIG. 4 is a drawing depicting an elevation view of the system depicted in FIG. 3.

FIG. 3 and FIG. 4 show a system 100 for removing a material from the peripheries and edges of a substrate, such as a glass substrate. The system includes a shuttle 20 which moves along shuttle slide 22 between an introduction station 30 and an exit station 40. The components of system 100 between introduction station 30 and exit station 40 are enclosed in housing 19, which can be at least partially transparent so that system 100 can be visually monitored from outside the housing. Various components may also be mounted on surface 18, which may be the floor, or may be elevated as with a table or other bench. Preferably, introduction station 30, shuttle 20, and exit station 40 are positioned in a collinear fashion allowing in-line processing of a photovoltaic device ("PV device") 10. As shown in FIG. 3 and FIG. 4, substrate 11 coated with a semiconductor material is introduced onto shuttle 20 at introduction station 30 which may be a conveyor belt, a roller conveyor or any other appropriate conveying device.

Substrate 11 is introduced to first region 24 of shuttle 20 proximate to first terminal position 31. Preferably substrate 11 is squared as it is positioned in first region 24 of shuttle 20. Substrate 11 is then secured to shuttle 20 by activating non-marking shuttle securing devices 28, such as suction cups.

Figure 5:
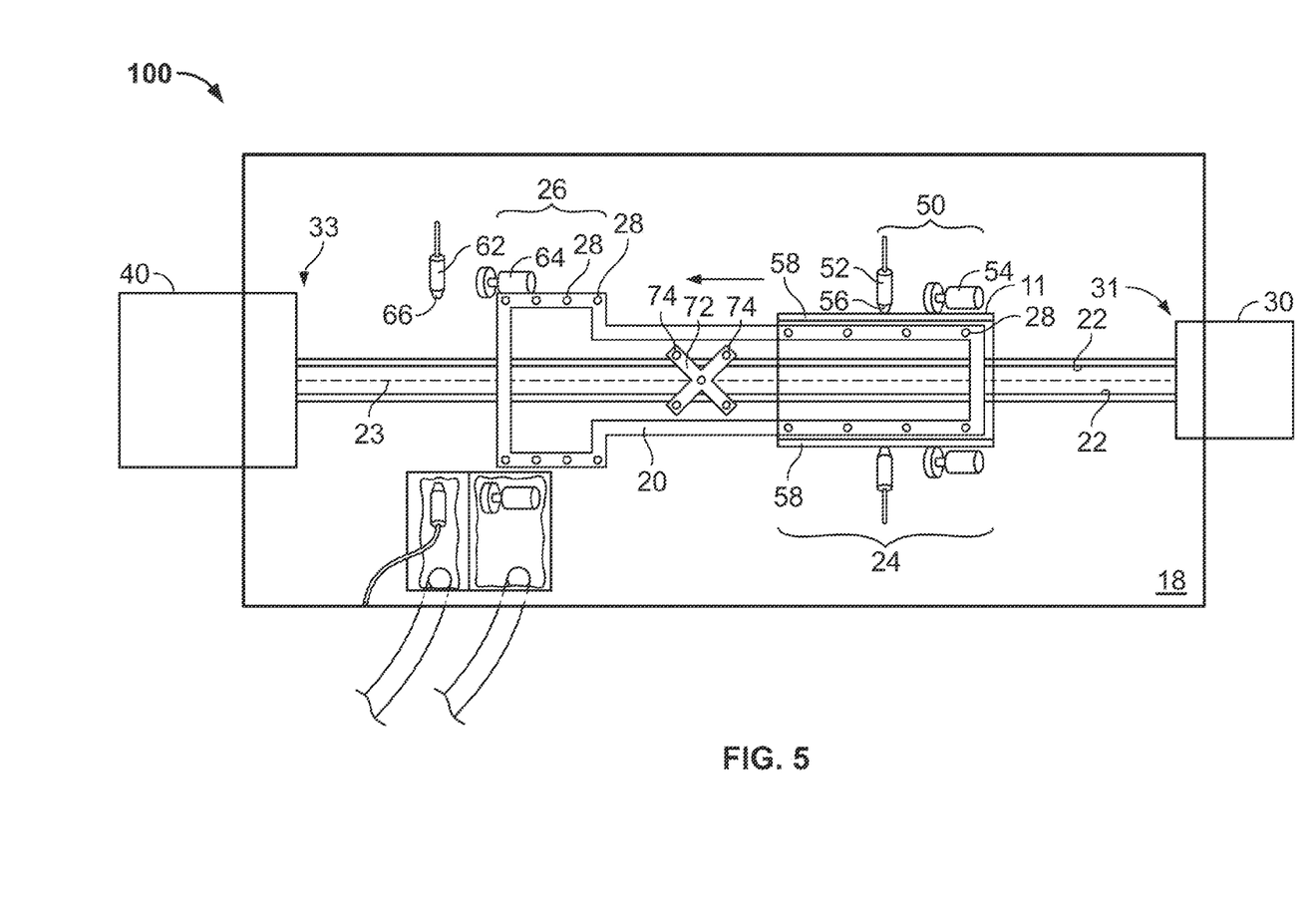
FIG. 5 is a drawing depicting a plan view of the system at an stage subsequent to the stage depicted in FIG. 3 and FIG. 4.
Figure 6:
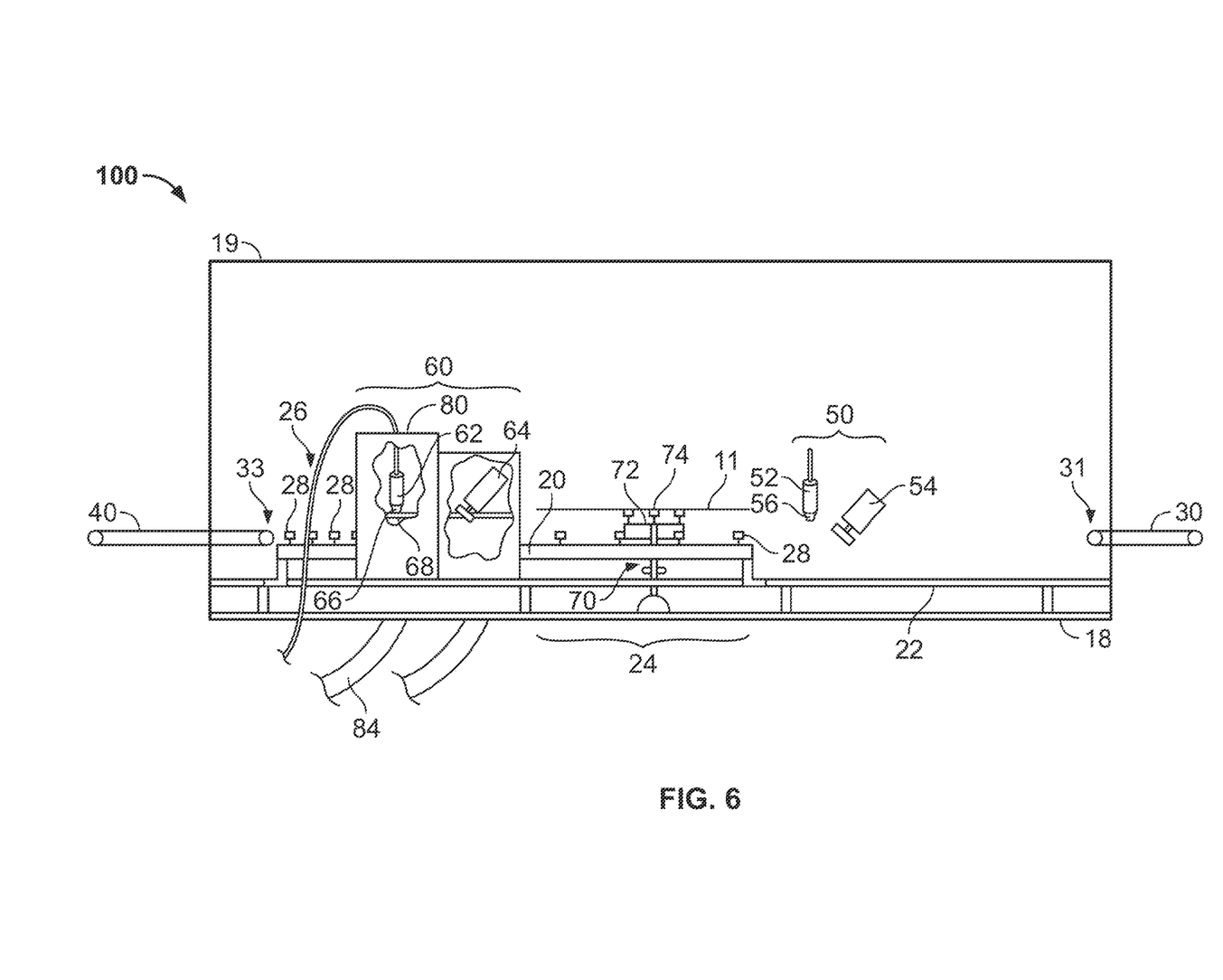
FIG. 6 is a drawing depicting an elevation view of the system at an stage subsequent to the stage depicted in FIG. 5.
Figure 7:
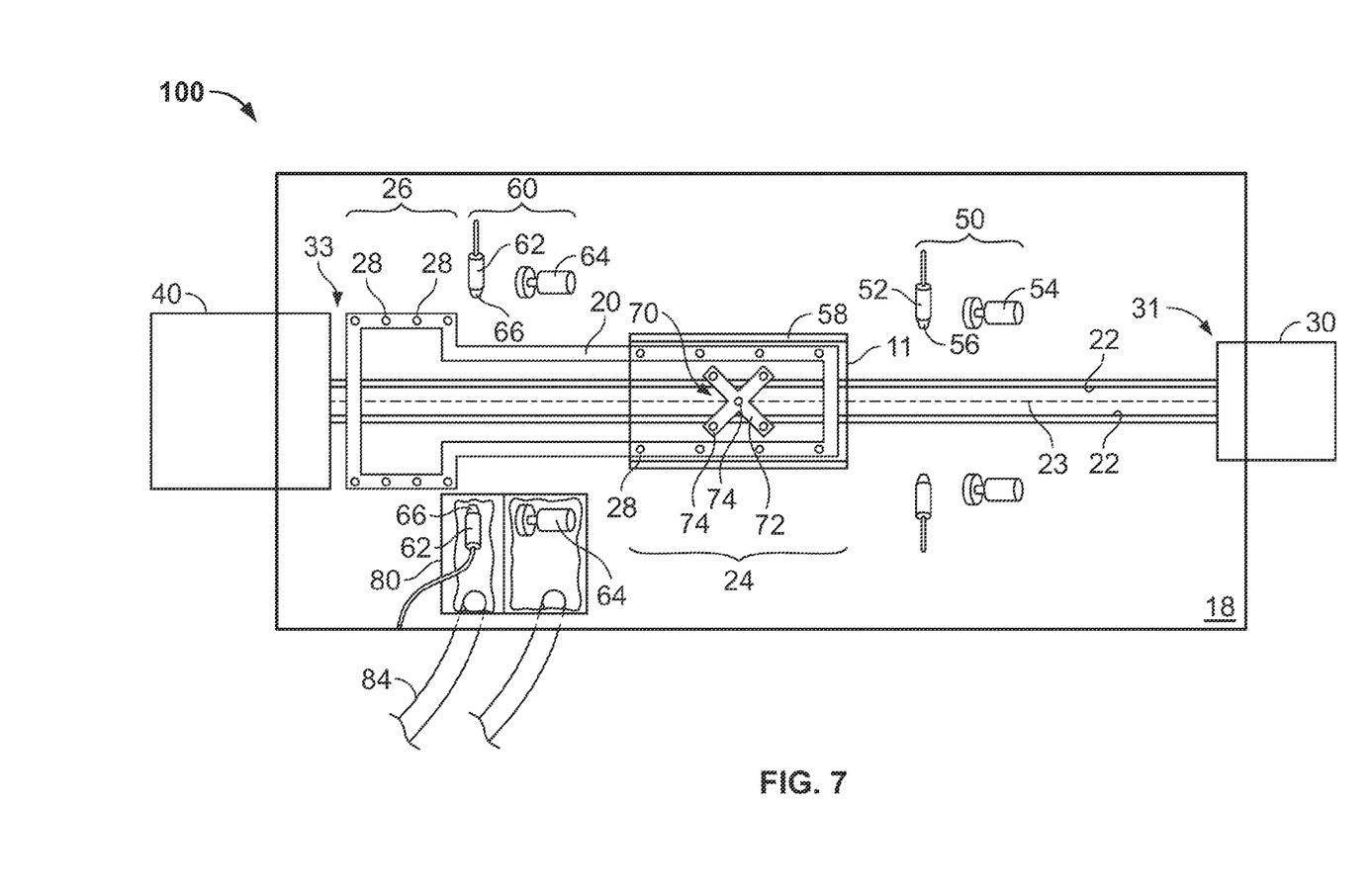
FIG. 7 is a drawing depicting an elevation view of the system depicted in FIG. 6.

Next, as shown in FIG. 5, FIG. 6, and FIG. 7, shuttle 20 is moved along shuttle slide 22. The path of shuttle 20 between introduction station 30 and exit station 40 defines the transport axis 23 of system 100. FIG. 5 shows shuttle 20 transporting substrate 11 secured to first region 24 such that shuttle 20 moves along shuttle slide 22 toward second terminal position 33 and exit station 40. As shuttle 20 transports substrate 11, substrate 11 passes through a first film removal station 50 proximate to first terminal position 31. As shown in FIG. 5, first film removal station 50 can include a sandblasting unit 52 having a sandblasting nozzle 56 directed toward the periphery of the coated surface of substrate 11. The coated surface can face upward or downward. As substrate 11 passes nozzle 56, which is within effective film removal range of substrate 1, the film is removed from the periphery of the coated surface leaving a blasted peripheral portion 58 of substrate 11 having substantially no remaining semiconductor material coating in the blasted peripheral portion 58.

Film removal station 50 may also include a buffing wheel 54 to provide additional capability for removing film from an edge of substrate 11. Film removal station 50 can include two sandblasting units for removing film from opposite peripheries of the coated surface of substrate 11 in the same step, and substantially simultaneously, as shown in FIG. 5. The width of blasted peripheral portions 58 may be adjusted based on the nozzle design, placement, and pressure and other relevant factors. The width of portion 58 can be less than about 50 mm, preferably about 14 mm, for manufacturing PV devices, although the width may be adjusted to a broad range of values according to the user's needs or desires.

FIG. 6 and FIG. 7 show shuttle 20 at a second terminal position 33 of system 100 such that a second region 26 of shuttle 20 is adjacent to exit station 40. At this stage, the semiconductor material coating has been removed along the length of the edges and the blasted peripheries of the substrate 11 and substrate 11 is positioned substantially above rotation station 70 having a support 72 with securing devices 74, such as suction cups. After shuttle 20 has moved to second terminal position 33, support 72 extends through shuttle 20 such that support securing devices 74 engage substrate 11. As shuttle securing devices 28 disengage substrate 11 and support 72 continues extending, substrate 11 is supported above the first region 24 of shuttle 20.

Figure 8:
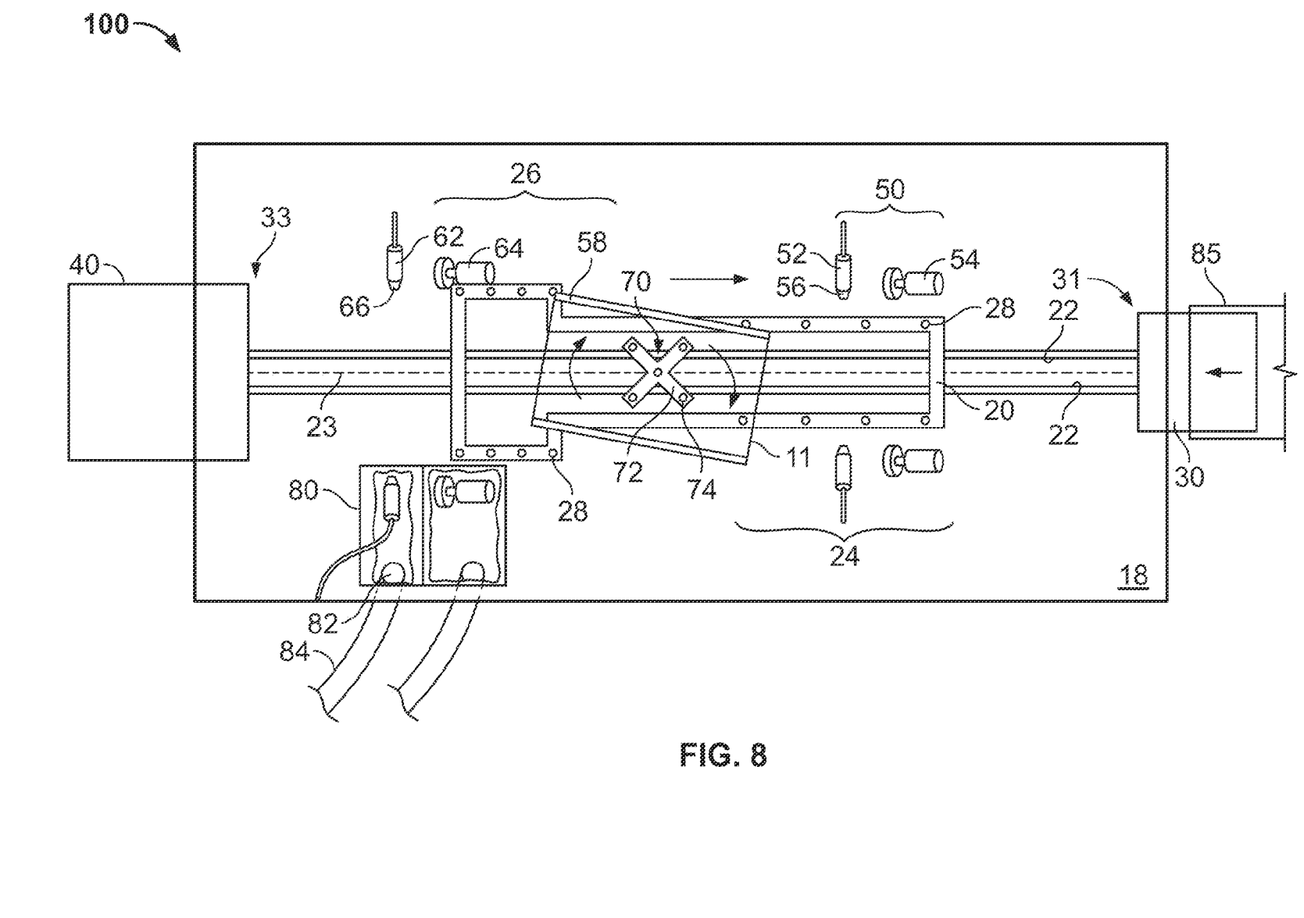
FIG. 8 is a drawing depicting a plan view of the system at a stage subsequent to the stage depicted in FIG. 6 and FIG. 8.

FIG. 6 and FIG. 8 show support 72 rotating substrate 11 at rotation station 70 above shuttle 20 to a second orientation as compared to the orientation of substrate 11 being transported past first film removal station 50 while supported in first region 24 of shuttle 20. In certain embodiments, substrate 11 can be rotated 90 degrees from its orientation at first region 24. After substrate 11 is supported over shuttle 20 and, optionally, while being rotated by support 72 at rotation station 70, shuttle 20 is moved back toward first terminal position 31 adjacent to introduction station 30, as shown in FIG. 8. At this time, a second substrate 85 can be positioned at introduction station 30.

Figure 9:
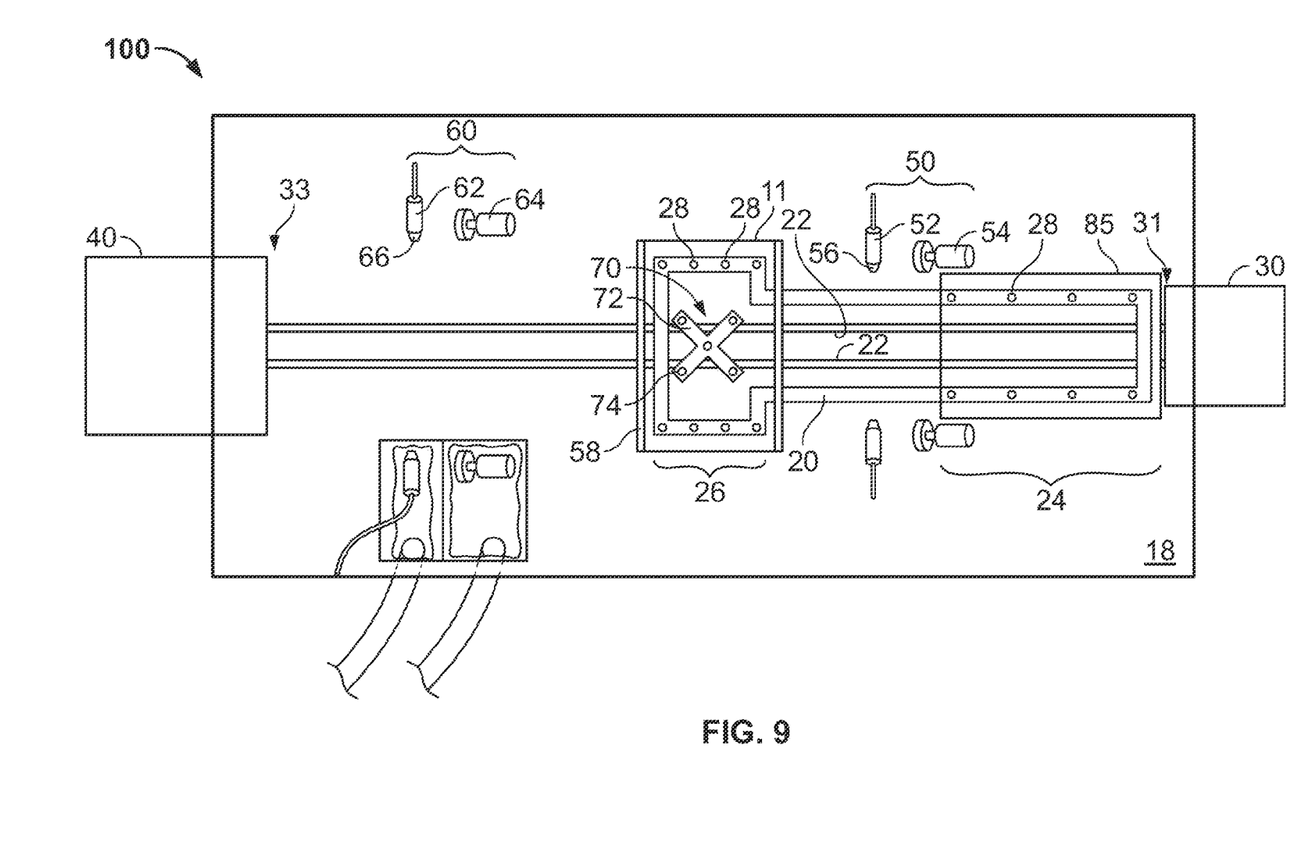
FIG. 9 is a drawing depicting a plan view of the system at a stage subsequent to the stage depicted in FIG. 8.

Referring to FIG. 9, shuttle 20 is positioned to first terminal position 31 and second substrate 85 is introduced to first region 24 of shuttle 20 in the same manner that substrate 11 was introduced to first region 24 and secured by securing devices 28. As shown in FIG. 9, when shuttle 20 is positioned at first terminal position 31 such that first region 24 is adjacent to introduction station 30, second region 26 of shuttle 20 is positioned at rotation station 70 such that the rotated substrate 11 is supported by support 70 over second region 26. At this stage, support 72 retracts toward second region 26 of shuttle 20, securing devices 74 release, and substrate 11 is secured by shuttle securing devices 28 at second region 26.

Figure 10:
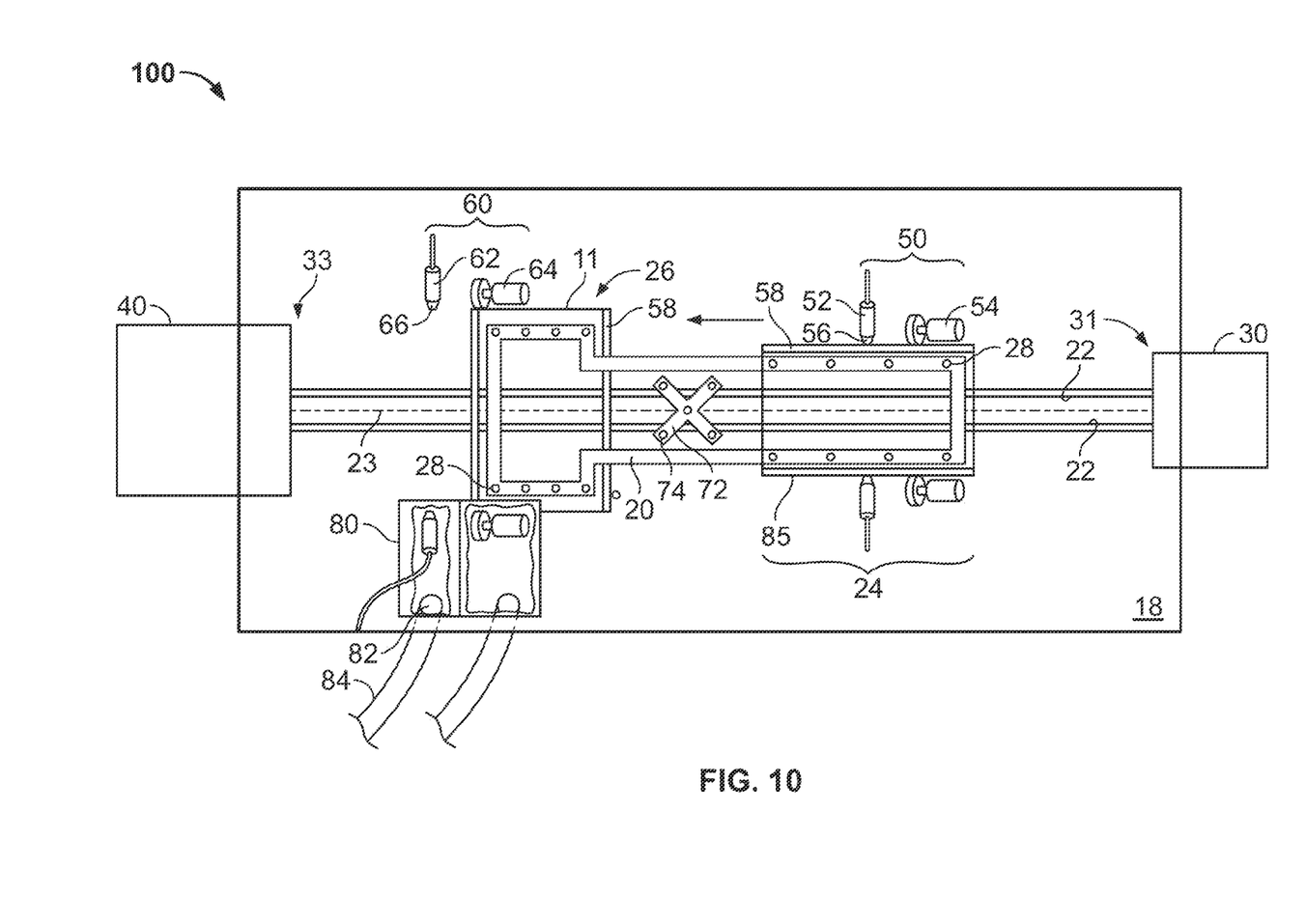
FIG. 10 is a drawing depicting a plan view of the system at a stage subsequent to the stage depicted in FIG. 9.

As shown in FIG. 10, shuttle 20 is then moved back toward second terminal position 33 along transport axis 23 and exit station 40 transporting both first substrate 11 at second region 26 and second substrate 85 at first region 24. As shuttle 20 travels along this transport axis, second substrate 85 passes through first removal station 50, in the same manner that first substrate 11 was transported through first removal station 50, as described above. Also as shuttle 20 moves back to second terminal position 33, first substrate 11 is passed through a second film removal station 60 oriented proximate to second terminal position 33 and collinear with first film removal station 50. Second removal station 60 can include a sandblasting unit 62 with a sandblasting nozzle 66. Since substrate 11 is now rotated 90 degrees, a second periphery of substrate 11 is exposed to nozzle 66 in film removal station 60.

Figure 11:
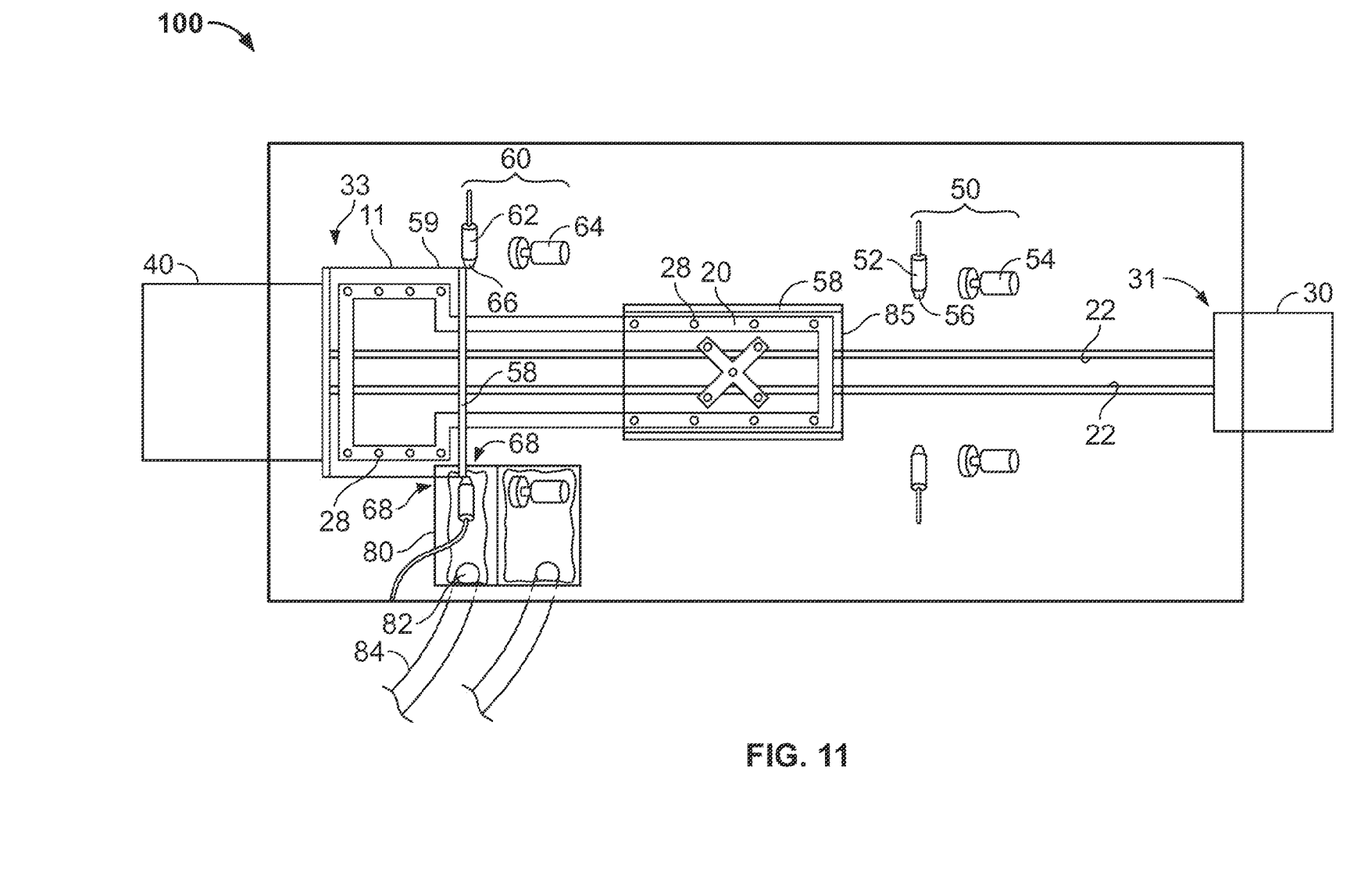
FIG. 11 is a drawing depicting a plan view of the system at a stage subsequent to the stage depicted in FIG. 10.
Figure 12:
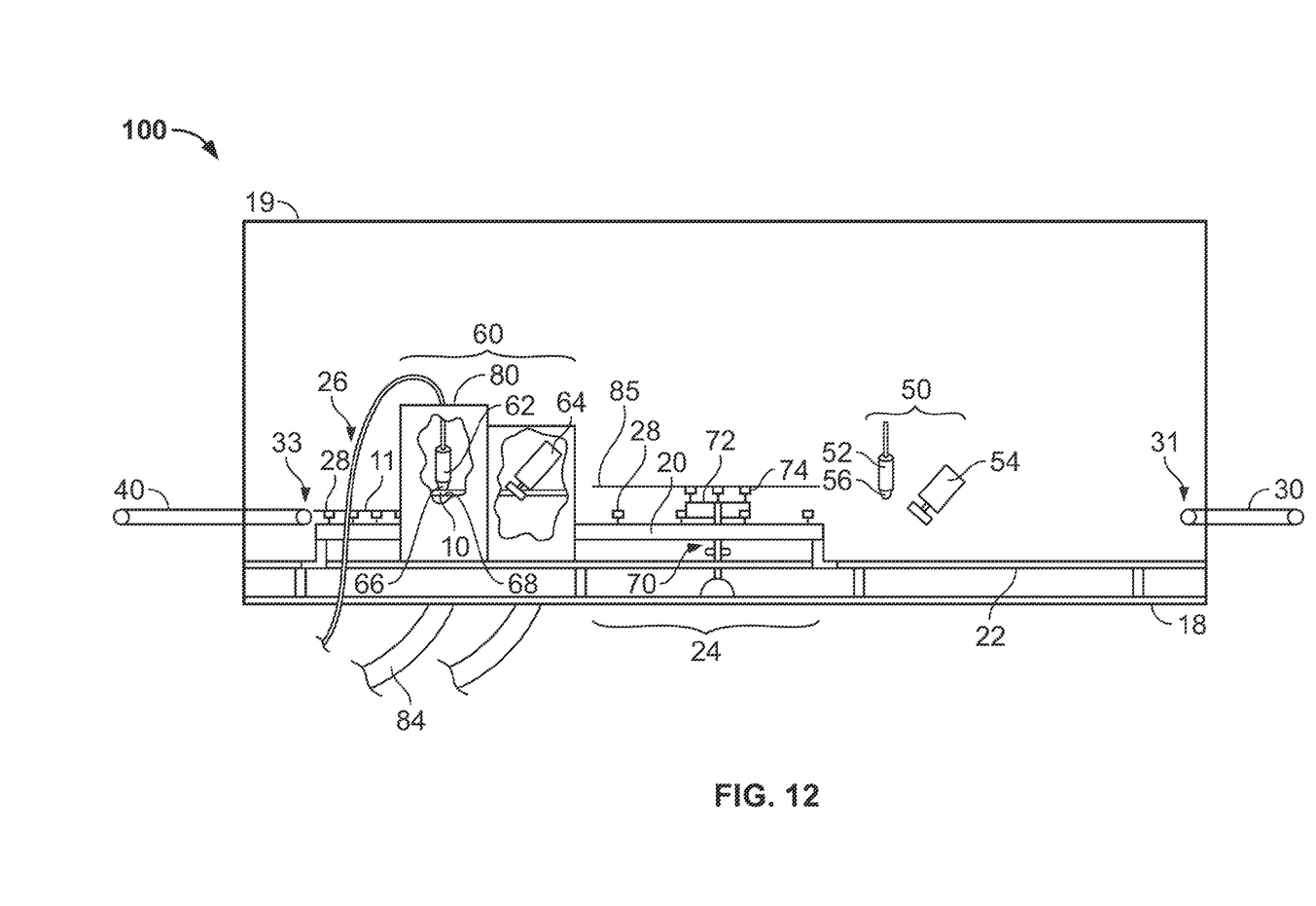
FIG. 12 is a drawing depicting an elevation view of the system depicted in FIG. 11.

FIG. 11 and FIG. 12 show shuttle 20 at the second terminal position 33. At this position, second substrate 85 has passed through first film removal station 50 in the same manner first substrate 11 passed through first film removal station 50 prior to rotation. Likewise, at this stage first substrate 11 has passed through second removal station 60, providing blasted peripheral portions 59 of substrate 11. As with first film removal station 50, second film removal station 60 can include multiple sandblasting units 62 and nozzles 66. Buffing wheels 64 may be included to buff the edges of substrate 11.

Also shown in FIG. 10 and FIG. 11 is blast box 80 which substantially encloses sandblasting unit 62 and each nozzle 66. Blast box 80 is only shown in one portion of second film removal station 60 for the sake of clarity. A blast box can be provided for each sandblasting unit 52, 62 and nozzle 56, 66. Buffing wheels 54, 64 can optionally be enclosed in blast boxes. As shown in FIG. 12, blast box 80 includes a passage 68 for a periphery of substrate 11 so that substrate 11 passes through film removal stations 50, 60 partially enclosed in blast box 80. As shown in the plan view presented in FIG. 11 blast box 80 overlaps substrate 11, the periphery of which passes through passage 68.

Blast residue generated in system 100 may present environmental and health concerns, and may also impede the efficiency of system 100 if not managed effectively. As a result, blast box 80 may include exhaust port 82 and exhaust hose 84 for collecting and removing sandblasting residue away from system 100. Additionally, housing 19 may be negatively pressurized relative to the surrounding atmosphere and this negative pressure, which may be created by evacuating air from housing 19, effectively contains sandblast residue within housing 19.

At second terminal position 33, as shown in FIG. 12, second substrate 85 is positioned substantially at rotation station 70. As with substrate 11 before, second substrate 85 is supported over shuttle 20 by extended support 72.

Figure 13:
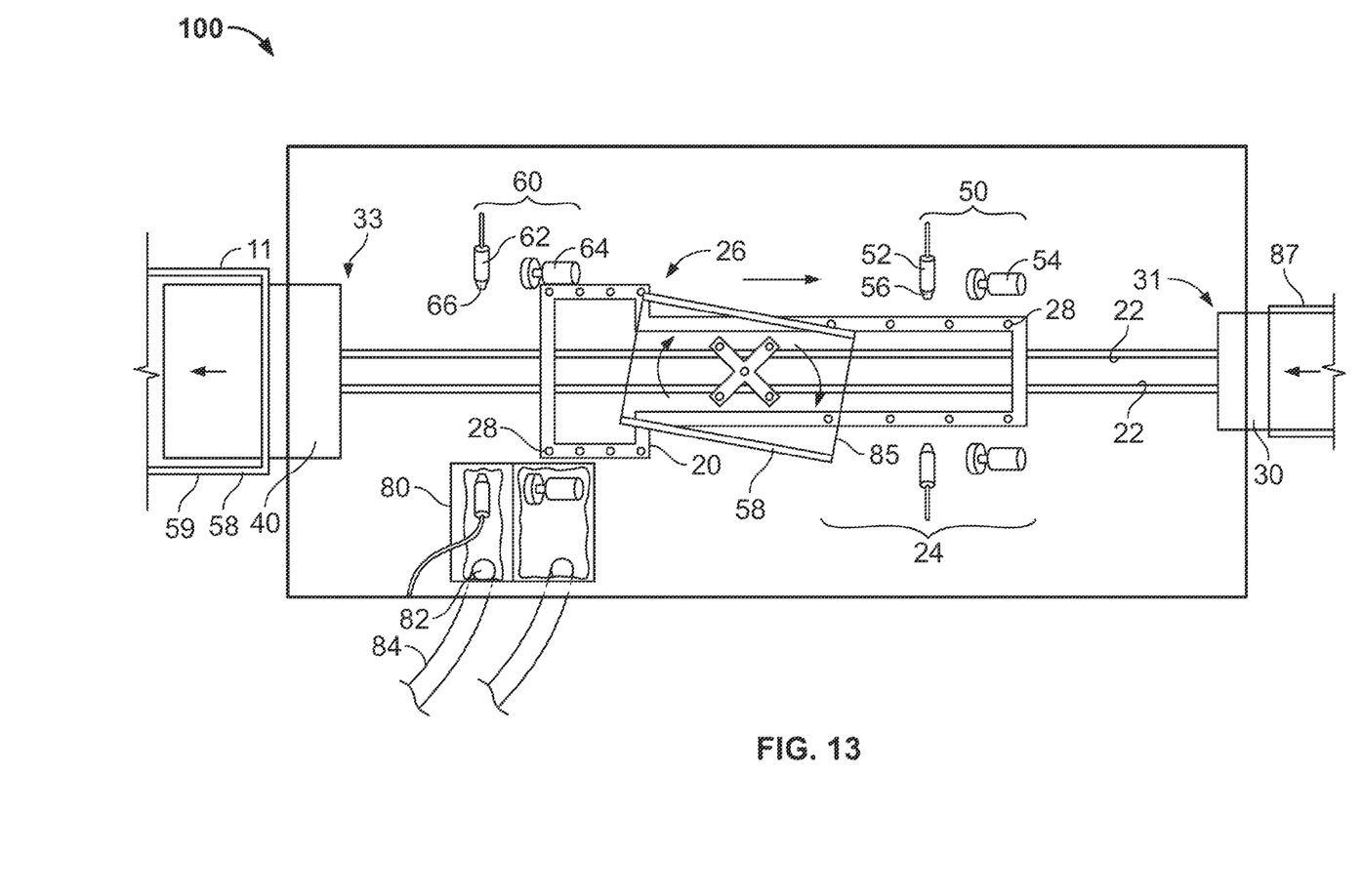
FIG. 13 is a drawing depicting a plan view of the system at a stage subsequent to the stage depicted in FIG. 11 and FIG. 12.

Referring now to FIG. 13, after second substrate 85 has been supported and after first substrate 11 exits system 100 at exit station 40, shuttle 20 moves back toward first terminal position 31. Second substrate 85 is rotated for positioning at second region 26 of shuttle 20 and a third substrate 87 is positioned at introduction station 30 for placement at first region 24 of shuttle 20 after shuttle 20 moves to first terminal position 31. After positioning of third substrate 87 at first region 24 of shuttle 20, the shuttle returns to second terminal position 33 and in the process passes second substrate 85 through second film removal station 60 and passes third substrate 87 through first film removal station 50. In this manner, the film removal method continues by simultaneously processing multiple substrates.

Although the method and system are described with reference to removing semiconductor material coating from a photovoltaic device, it should be apparent that method and system may be utilized for processing other substantially planar substrates having film-coated, substantially planar surfaces. As such, the scope of the claims should not be defined narrowly based on the foregoing description.

What is claimed is:

1. A system for removing a film from a plurality of peripheries of a surface of a substantially planar substrate comprising:
   an introduction station;
   an exit station;
   a shuttle positioned between the introduction station and the exit station, wherein the shuttle is configured to transport the substrate from a first terminal position adjacent to the introduction station to a second terminal position at a distance from the introduction station, the first terminal position and second terminal position defining a transport axis, and wherein the shuttle has a frame configured to hold the substrate, a first shuttle end directed toward the first terminal position, and a second shuttle end directed toward the second terminal position;
   a rotation station positioned between the first terminal position and the second terminal position;
   a first film removal station proximate to the first terminal position; and
   a second film removal station proximate to the second terminal position.

2. The system of claim 1, wherein the rotation station comprises a support configured to rotate the substrate around an axis perpendicular to the transport axis.

3. The system of claim 2, wherein the support comprises a suction cup for securing the substrate to the support.

4. The system of claim 2, wherein the support rotates the substrate 90 degrees.

5. The system of claim 1, further comprising a housing substantially enclosing the first film removal station, the rotation station, and the second film removal station.

6. The system of claim 5, wherein the housing has an operating pressure that is lower than the pressure external to the housing.

7. The system of claim 5, wherein a portion of the housing is transparent.

8. The system of claim 1, wherein the shuttle comprises a plurality of suction cups configured to maintain the position of the substrate on the frame.

9. The system of claim 1, wherein the first shuttle end is configured to hold the substrate in a first orientation and the second shuttle end is configured to hold the substrate in a second orientation.

10. The system of claim 1, wherein the first film removal station comprises a first film removal nozzle.

11. The system of claim 10, wherein the first film removal nozzle is positioned such that a periphery of a surface of the substrate passes within film removal range of the first film removal nozzle as the shuttle moves along the transport axis passing the rotation station.

12. The system of claim 10, wherein the second film removal station comprises a second film removal nozzle.

13. The system of claim 12, wherein the second film removal nozzle is positioned such that a periphery of a surface of the substrate passes within film removal range of the second film removal nozzle as the shuttle moves along the transport axis after passing the rotation station.

14. The system of claim 1, wherein each film removal station comprises two film removal nozzles positioned such that each of two peripheries of a surface of a planar substrate passes within film removal range of the respective film removal nozzle as the shuttle moves along the transport axis.

15. The system of claim 10, wherein the film removal nozzle is a sandblasting nozzle.

16. The system of claim 15, further comprising a blast box enclosing the sandblasting nozzle, wherein the blast box includes a passage through which the nozzle accesses the periphery of the substrate.

17. The system of claim 16, the blast box further comprising an exhaust port configured to withdraw sandblasting residue from the blast box.

18. The system of claim 1, wherein each film removal station comprises a buffer wheel configured to be positioned to contact a periphery of the substrate as the shuttle moves along the transport axis.

19. The system of claim 1, further comprising a guide configured to position the substrate on the first end of the shuttle.

20. A method for removing a film from a plurality of peripheries of a surface of a substantially planar substrate comprising:
   introducing the planar substrate to a first region of a shuttle;
   transporting the shuttle from a first terminal position toward a second terminal position along a transport axis such that a first periphery of a surface of the substrate passes within film removal range of a first film removal station as the shuttle moves along the transport axis to a rotation station;
   rotating the substrate at the rotation station;
   transporting the shuttle from the rotation station to the second terminal position such that a second periphery of a surface of the substrate passes within film removal range of a second film removal station as the shuttle moves along the transport axis to the second terminal position; and
   removing the substrate from the shuttle.

21. The method of claim 20, wherein rotating the substrate at the rotation station comprises removing the substrate from the first region of the shuttle, altering the orientation of the substrate relative to the transport axis, moving the shuttle to position a second region of the shuttle to receive the substrate, and positioning the planar substrate in the second region of the shuttle.

22. The method of claim 20, wherein introducing the planar substrate comprises moving the substrate with an introduction conveyor.

23. The method of claim 20, wherein removing the substrate comprises moving the substrate with an exit conveyor.

24. The method of claim 20, wherein the first film removal station comprises a sandblasting nozzle.

25. The method of claim 24, wherein the second film removal station comprises a sandblasting nozzle.

26. The method of claim 24, further comprising withdrawing sandblasting residue from the first film removal station.

27. The method of claim 20, wherein the first film removal station and the second film removal station are enclosed in a controlled atmosphere.

28. The method of claim 27, further comprising reducing the controlled atmosphere to a pressure lower than pressure external to the controlled atmosphere.

29. The method of claim 20, further comprising positioning the planar substrate on the shuttle.

30. A system for removing a film from a plurality of peripheries of a surface of a substantially planar substrate comprising:
   a housing;
   a first film removal zone inside the housing;
   a second film removal zone inside the housing adjacent to the first film removal zone;
   a rotation zone between the first removal zone and the second removal zone; and
   a shuttle configured to transport the substrate through the first film removal zone to the rotation zone and from the rotation zone through the second film removal zone.

* * * * *